United States Patent
Owada et al.

(10) Patent No.: US 7,579,277 B2
(45) Date of Patent: Aug. 25, 2009

(54) SEMICONDUCTOR DEVICE AND METHOD FOR FABRICATING THE SAME

(75) Inventors: Tamotsu Owada, Kawasaki (JP); Hisaya Sakai, Kawasaki (JP); Shun-ichi Fukuyama, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 104 days.

(21) Appl. No.: 11/451,528

(22) Filed: Jun. 13, 2006

(65) Prior Publication Data

US 2007/0197032 A1 Aug. 23, 2007

(30) Foreign Application Priority Data

Feb. 22, 2006 (JP) ............................. 2006-044906

(51) Int. Cl.
*H01L 21/44* (2006.01)
(52) U.S. Cl. .................. 438/685; 438/653; 427/249.15; 257/753; 257/E21.195; 257/E21.201
(58) Field of Classification Search ................ 438/685, 438/653, 677, 608; 427/249.15; 257/753, 257/761, E21.201, E21.202, E21.195
See application file for complete search history.

(56) References Cited

U.S. PATENT DOCUMENTS 6,630,396 B2 * 10/2003 Yang et al. .................. 438/628
6,855,645 B2 * 2/2005 Tang et al. .................. 438/778
7,084,070 B1 * 8/2006 Lee et al. ..................... 438/714
2005/0009356 A1 * 1/2005 Kojima et al. ............... 438/700
2005/0176216 A1 * 8/2005 Cui et al. ..................... 438/459
2005/0277302 A1 * 12/2005 Nguyen et al. .............. 438/763
2006/0141778 A1 * 6/2006 Tonegawa et al. ........... 438/638
2008/0042283 A1 * 2/2008 Purushothaman et al. ... 257/745
2008/0044668 A1 * 2/2008 Dimitrakopoulos et al. . 428/446

FOREIGN PATENT DOCUMENTS

JP  2005-136301 A  5/2005

* cited by examiner

*Primary Examiner*—Caridad M Everhart
(74) *Attorney, Agent, or Firm*—Fujitsu Patent Center (57) ABSTRACT

A semiconductor device in which the diffusion of copper from a wire is prevented and a method for fabricating such a semiconductor device. For example, a via groove and a wire groove are formed in a multilayer structure including a UDC diffusion barrier film, a porous silica film, a middle UDC stopper film, a porous silica film, a UDC diffusion barrier film, and the like, and the surfaces the UDC diffusion barrier film, the middle UDC stopper film, and the UDC diffusion barrier film that get exposed in the via groove and the wire groove are irradiated with hydrogen plasma, thereby making the surface of each exposed SiC film silicon-rich. After the plasma irradiation, a Ta film is formed in the via groove and the wire groove and copper is embedded in these grooves. By making the surface of each SiC film which is to touch the Ta film silicon-rich in advance, the crystal structure of the Ta film can be controlled so that copper cannot pierce through the Ta film. This prevents copper from diffusing from a wire.

10 Claims, 7 Drawing Sheets

SEMICONDUCTOR DEVICE AND METHOD FOR FABRICATING THE SAME

CROSS-REFERENCE TO RELATED APPLICATIONS

This application is based upon and claims the benefits of priority from the prior Japanese Patent Application No. 2006-044906, filed on Feb. 22, 2006, the entire contents of which are incorporated herein by reference.

BACKGROUND OF THE INVENTION (1) Field of the Invention

This invention relates to a semiconductor device and a method for fabricating a semiconductor device and, more particularly, to a semiconductor device having multilayer wiring and a method for fabricating such a semiconductor device.

(2) Description of the Related Art

In a multilayer wiring structure which is widely used now in semiconductor devices and the like, signal propagation speed depends mainly on wire resistance and the parasitic capacitance of an insulating film between wires. If the distance between wires is wider than or equal to 1 μm, inter-wire capacitance is small and the influence on the operation speed of the entire device is slight. However, if the distance between wires is narrower than or equal to about 0.5 μm, then the influence on the operation speed of the entire device is considerable. In particular, it is expected that circuits in which the distance between wires is narrower than or equal to 0.2 μm will be fabricated in the future. In such cases, inter-wire capacitance will have a very great influence on the operation speed of devices. In addition, in recent years the integration levels of semiconductor devices have risen and the distance between wires has become narrower. Accordingly, conventional wire thickness leads to an increase in inter-wire capacitance. Inter-wire capacitance can be reduced by reducing wire thickness and narrowing an insulating film region between wires. However, if wire thickness is reduced, wire resistance increases and the operation speed of circuits cannot be increased. Therefore, the use of an insulating film having a low dielectric constant is now considered the most effective measure to reduce inter-wire capacitance, and attention is riveted on low-k materials the dielectric constants of which are about 2.0 to 2.5 (see, for example, Japanese Patent Laid-Open Publication No. 2005-136301).

Low-k materials include organic polyarylene, organic polyarylether, inorganic hydrogen silsesquioxane (HSQ), organic-inorganic hybrid methylsilsesquioxane (MSQ), and a mixture of HSQ and MSQ. A coating process is performed for forming a film of each of these materials. The low-k materials also include silicon oxycarbide. In this case, a chemical vapor deposition (CVD) process is performed by using an organosiloxane-based material as source gas. Furthermore, the method of lowering a dielectric constant by forming a cavity in an insulating film of a low-k material may be adopted in place of forming a film. In this case, a balance must be achieved between a drop in the dielectric constant and degradation in the mechanical strength of the film caused by forming the cavity and the application of this method to devices is under study.

In the multilayer wiring structure, usually minute wires are used in lower layers near elements where the above problem of inter-wire capacitance becomes more and more important. Accordingly, the use of a low-k material is strongly required especially in such regions. In addition, in the regions where such minute wires are used, inter-wire capacitance between two layers one of which is formed on the other cannot be neglected because of the spread of an electric field. Accordingly, there is now a great necessity to form insulating films of a low-k material not only between wires in the horizontal direction but also between wires in the vertical direction.

If insulating films of a low-k material are formed between wires and between layers in the multilayer wiring structure, a dielectric constant can be lowered. Compared with a conventional material such as a silicon oxide ($SiO_2$) film, however, the mechanical strength is low. Insulating films in the multilayer wiring structure cannot be replaced excessively with insulating films of a low-k material. Accordingly, lowering the dielectric constants of a diffusion barrier film which prevents a wire material such as copper (Cu) from diffusing, a cap film formed on an insulating film, an etching stopper film formed beneath a layer to be etched, and the like which occupy narrower regions in the multilayer wiring structure has recently been required.

Silicon nitride (SiN), oxygen-doped silicon carbide (ODC) or the like which is formed by the CVD method can be used as the diffusion barrier film etc. The dielectric constants of SiN and ODC are about 7.0 and about 4.5 to 5.0, respectively.

Attention has recently been riveted on undoped silicon carbide (UDC) which is formed at low oxygen concentration or in an oxygen-free state by using organosilane as source gas and the carbon (C) content of which is higher as a material for a diffusion barrier film etc. The dielectric constant of UDC can be made 2.5 to 4.5. UDC used as a diffusion barrier film serves as a good barrier against copper diffusion. However, if UDC is used in the multilayer wiring structure, the following problem may arise.

To form the multilayer wiring structure by a damascene method, a wire groove is formed first in an insulating film. A thin barrier metal film of, for example, tantalum (Ta) is formed in the wire groove. Copper, being a conductive material, is then embedded in the wire groove to form a copper wire. The barrier metal film formed in the wire groove is conductive and prevents copper from diffusing from the copper wire to the insulating film. An insulating material is used for forming a diffusion barrier film, an etching stopper film, and the like on the copper wire and for forming a cap film on the insulating film before the formation of the wire groove. That is to say, these films are formed near the copper wire.

However, if UDC having a low dielectric constant is used for forming the diffusion barrier film and the like, copper contained in the copper wire may pierce through the barrier metal film in a region in a wiring structure where UDC is touching the barrier metal film, and diffuse into the insulating film, in the process of forming the multilayer wiring structure or at the time of the operation of the device. The diffusion of copper into the insulating film causes an increase in leakage current or wire resistance. Therefore, techniques for realizing a multilayer wiring structure in which a dielectric constant as a whole is low and in which the diffusion of a wire material into an insulating film is suppressed and a semiconductor device having such a multilayer wiring structure are greatly required.

SUMMARY OF THE INVENTION

The present invention was made under the background circumstances described above. An object of the present invention is to provide a high-performance semiconductor device with high reliability and a method for fabricating such a semiconductor device.

In order to achieve the above object, a method for fabricating a semiconductor device having multilayer wiring is provided. This method comprises the steps of forming a multilayer structure including SiC films and insulating films; forming a groove in the multilayer structure; making a surface of an SiC film which gets exposed in the groove at the time of the groove being formed silicon-rich; forming a barrier metal film in the groove; and embedding a conductive material in the groove in which the barrier metal film is formed.

In addition, in order to achieve the above object, a semiconductor device having multilayer wiring is provided. This semiconductor device comprises a multilayer structure including SiC films and insulating films; a groove which is formed in the multilayer structure and in which the SiC films are exposed; a barrier metal formed in the groove; and a conductive material embedded in the groove in which the barrier metal is formed, surfaces of the SiC films which touch the barrier metal being silicon-rich.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENT

An embodiment of the present invention will now be described with reference to the drawings.

A copper diffusion phenomenon which occurs when a diffusion barrier film is formed of UDC will be described first.

Figure 1:
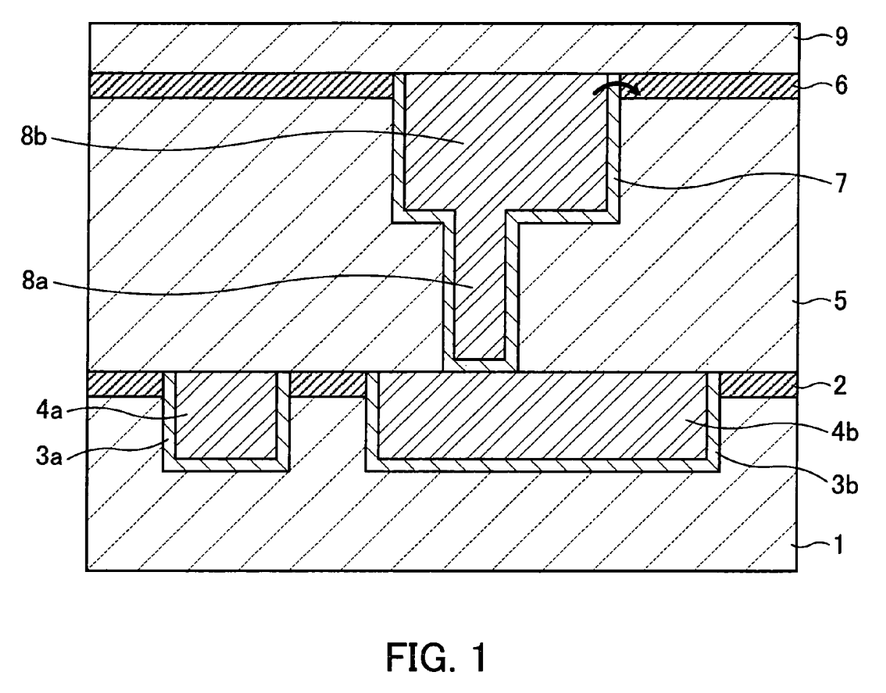
FIG. 1 is a view for describing a copper diffusion phenomenon.

FIG. 1 is a view for describing a copper diffusion phenomenon. FIG. 1 is a schematic sectional view showing an important part of an example of a multilayer wiring structure formed by using the damascene method.

In the multilayer wiring structure shown in FIG. 1, Ta barrier films 3a and 3b and Cu wires 4a and 4b are formed in an insulating film 1 and a UDC film 2 by the damascene process. A Ta barrier film 7, a Cu via 8a, and a Cu wire 8b are formed in an insulating film 5 and a UDC film 6 formed on this layer by a dual damascene process. Another insulating film 9 is formed thereon. In this multilayer wiring structure, the Cu wire 4b in the lower layer is connected to the Cu wire 8b in the upper layer via the Cu via 8a.

As indicated by an arrow in FIG. 1, for example, in this multilayer wiring structure, copper of the Cu wire 8b may diffuse from a region where the Ta barrier film 7 is touching the UDC film 6 into the UDC film 6 or the insulating film 5 in the process of forming the multilayer wiring structure or at the time of the operation of the device. Such a diffusion phenomenon may also occur in a region in the lower layer where the Ta barrier film 3a or 3b is touching the UDC film 2.

Whether such a copper diffusion phenomenon occurring in the multilayer wiring structure can be detected based on an increase in leakage current or wire resistance. In some cases, copper diffusion occurs on such a scale that it can be confirmed by observing the sectional structure with an electron microscope or the like.

Results obtained by examining the mechanism of the occurrence of such a copper diffusion phenomenon will now be described. Each of the following examples is obtained by forming a Ta film on a UDC or ODC film by the CVD method.

Figure 2:
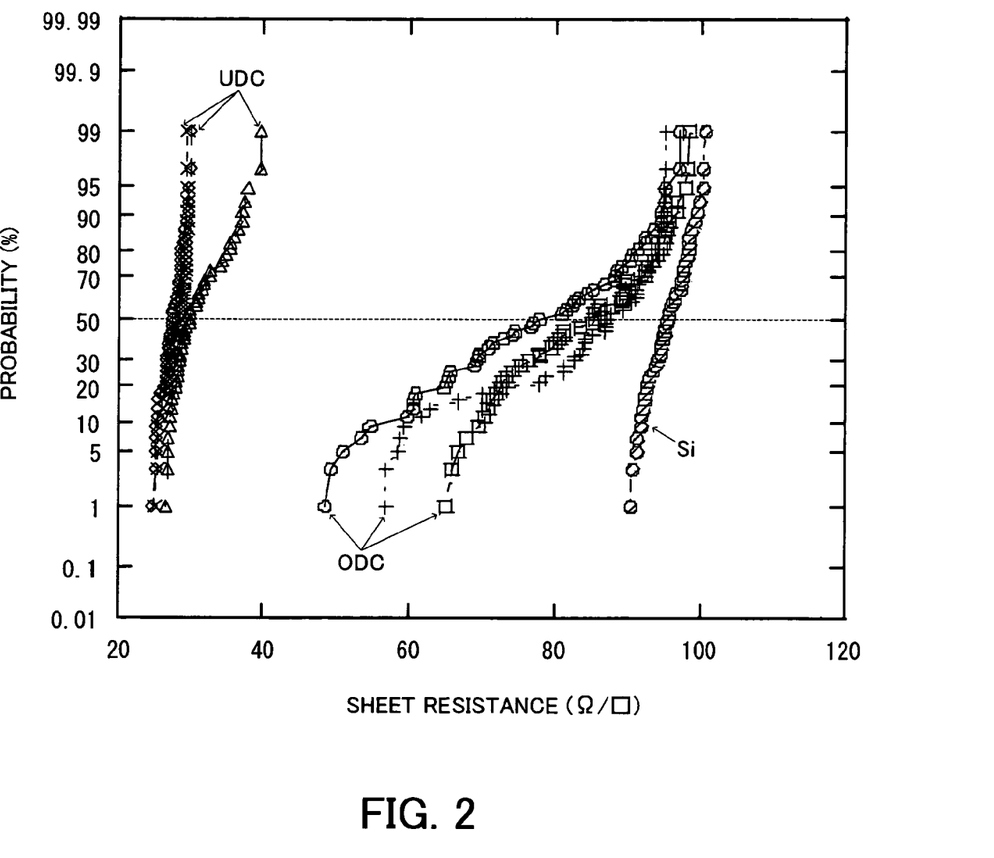
FIG. 2 shows results obtained by measuring the sheet resistance of Ta films formed on SiC films.

FIG. 2 shows results obtained by measuring the sheet resistance of Ta films formed on SiC films. In FIG. 2, a horizontal axis indicates the sheet resistance ($\Omega/\square$) of the Ta films and a vertical axis indicates a probability (%).

Three samples (indicated by the letters "UDC" in FIG. 2) obtained by forming Ta films with a thickness of 18 nm on UDC films with different dielectric constants and three samples (indicated by the letters "ODC" in FIG. 2) obtained by forming Ta films with a thickness of 18 nm on ODC films with different dielectric constants are used. In FIG. 2, sheet resistance values are measured at plural points on each Ta film and the probability that a point having each sheet resistance value exists is found. In addition, a sample (indicated by the letters "Si" in FIG. 2) obtained by forming a Ta film with a thickness of 18 nm on an Si film is used and the relationship between the sheet resistance value of the Ta film and the probability of existence is shown in FIG. 2.

As can be seen from FIG. 2, variation in the sheet resistance values of the Ta films in the three samples (UDC) obtained by forming the Ta films on the UDC films is small, compared with the three samples (ODC) obtained by forming the Ta films on the ODC films. Furthermore, the sheet resistance value at a probability level of 50 percent of the Ta film in the sample (Si) obtained by forming the Ta film on the Si film is about 95$\Omega/\square$. The sheet resistance values at a probability level of 50 percent of the Ta films in the three samples (ODC) obtained by forming the Ta films on the ODC films are about 80 to 85$\Omega/\square$. In other words, the sheet resistance values of the Ta films in the three samples (ODC) are slightly smaller than the sheet resistance value of the Ta film in the sample (Si). On the other hand, the sheet resistance values at a probability level of 50 percent of the Ta films in the three samples (UDC) obtained by forming the Ta films on the UDC films are about 30$\Omega/\square$. That is to say, the sheet resistance values of the Ta films in the three samples (UDC) are about one third of the sheet resistance value of the Ta film in the sample (Si) obtained by forming the Ta film on the Si film. This shows that the sheet resistance value of a Ta film depends largely on the type of a film formed beneath it.

Figure 3:
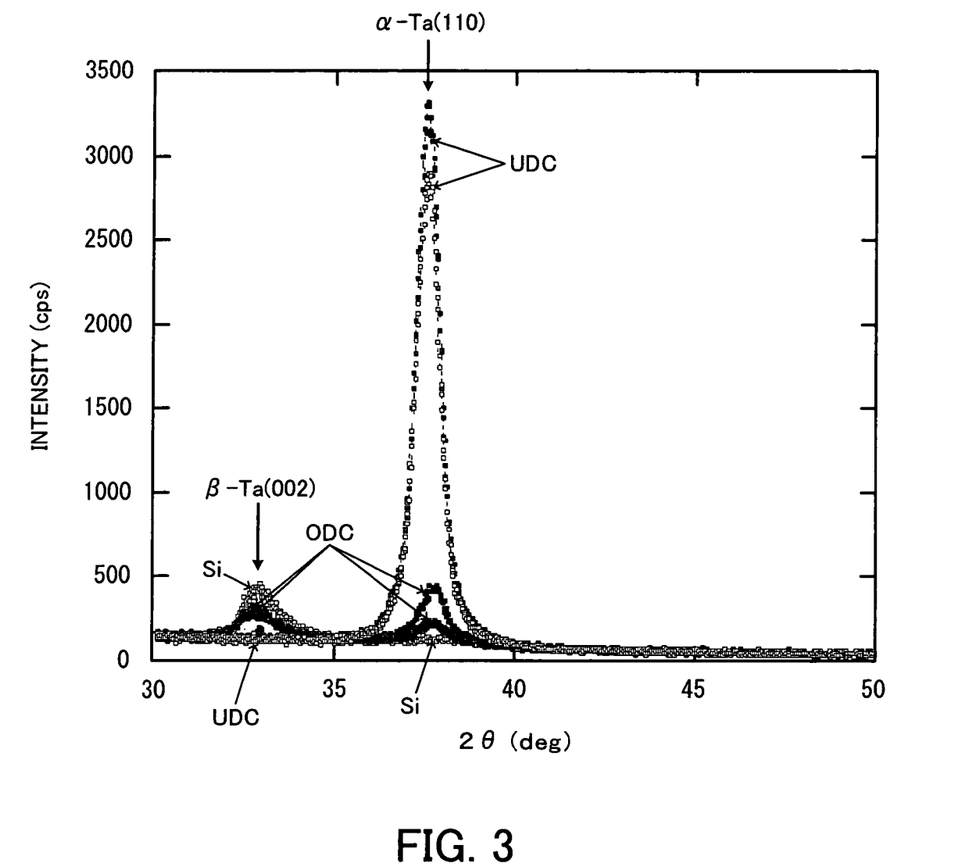
FIG. 3 shows results obtained by analyzing the crystal structure of Ta films formed on SiC films.

Results obtained by examining the crystal structure of a Ta film are shown in FIG. 3.

FIG. 3 shows results obtained by analyzing the crystal structure of the Ta films formed on the SiC films. An X-ray diffraction (XRD) system is used for analyzing the crystal structure of the Ta films. In FIG. 3, a horizontal axis indicates a diffraction angle 2θ (deg) and a vertical axis indicates the intensity (cps (counts/sec)) of diffracted X rays. In FIG. 3, results obtained by analyzing the crystal structure of the Ta film formed on the Si film are also shown.

As can be seen from FIG. 3, with the sample (indicated by the letters "Si" in FIG. 3) obtained by forming the Ta film on the Si film, a peak corresponding to β-Ta (002) appears. In FIG. 3, data for two samples obtained by forming Ta films on ODC films and data for two samples obtained by forming Ta films on UDC films are shown. With the two samples (indicated by the letters "ODC" in FIG. 3), peaks corresponding to β-Ta (002) and α-Ta (110) appear. With the two samples (indicated by the letters "UDC" in FIG. 3), peaks corresponding to β-Ta (002) hardly appear and high peaks corresponding to α-Ta (110) appear.

From the viewpoint of elementary composition, the carbon content of a UDC film having a lower dielectric constant is about 6 to 10 atom percent higher than the carbon content of an ODC film.

Figure 4:
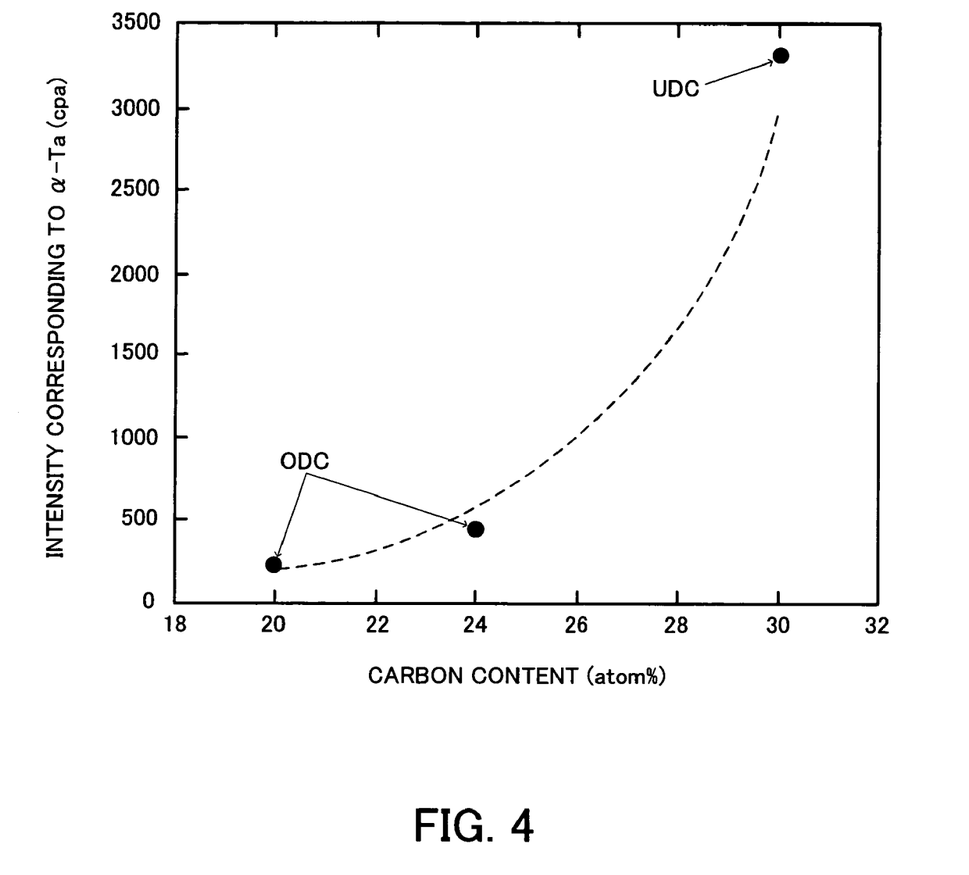
FIG. 4 shows the relationship between the carbon content of the SiC films and the crystal structure of the Ta films.

FIG. 4 shows the relationship between the carbon content of the SiC films and the crystal structure of the Ta films. In FIG. 4, a horizontal axis indicates the carbon content (atom percent) of the UDC films and the ODC films in the samples used for the analysis shown in FIG. 3 and a vertical axis indicates the intensity (cps) of diffracted X rays from α-Ta obtained in FIG. 3.

As can be seen from FIG. 4, compared with the case where the Ta films are formed on the ODC films the carbon content of which is low, α-Ta crystals are apt to form in the Ta films formed on the UDC films the carbon content of which is high. This shows that the crystal structure of a Ta film depends largely on the type of a film formed beneath it. This is the same with the sheet resistance value of a Ta film.

Conventionally, when an ODC film is used in a wire structure, the diffusion of copper from a copper wire into the ODC film or an insulating film has not occurred. Even if an Si film is used in place of an ODC film, the diffusion of copper from a copper wire into an insulating film does not occur. If these facts lead to a guess that the crystal structure of a portion of the Ta film 3a which the UDC film 2 is touching, a portion of the Ta film 3b which the UDC film 2 is touching, or a portion of the Ta film 7 which the UDC film 6 is touching may have an influence on a copper diffusion phenomenon which occurs in the case of using the UDC films 2 and 6 shown in FIG. 1.

Compared with the surface of an ODC film, there are many methyl radicals at the surfaces of the UDC film 2 which is touching the Ta films 3a and 3b and the UDC film 6 which is touching the Ta film 7 because of the process or the structure. That is to say, the state of the surfaces of the UDC films 2 and 6 differs significantly from the state of the surface of an ODC film or an Si film. Accordingly, the state of the surfaces of the UDC films 2 and 6 should be made equal or approximately equal to that of the surface of an ODC film or an Si film. To be concrete, for example, methyl radicals are made to dissociate from the surfaces of the UDC films 2 and 6 so that the state of their surfaces will approach that of the surface of an ODC film or an Si film. As a result, even if the UDC film 2 is touching the Ta films 3a and 3b and the UDC film 6 is touching the Ta film 7, it is possible to suppress the formation of α-Ta crystals in the portion of the Ta film 3a which the UDC film 2 is touching, the portion of the Ta film 3b which the UDC film 2 is touching, or the portion of the Ta film 7 which the UDC film 6 is touching and prevent copper from diffusing from the Cu wire 4a, 4b, or 8b, while maintaining characteristics based on a low dielectric constant.

To make methyl radicals dissociate from the surface of a UDC film, an effect obtained by irradiating the UDC film with, for example, hydrogen plasma was examined. Examination results will now be described.

Figure 5:
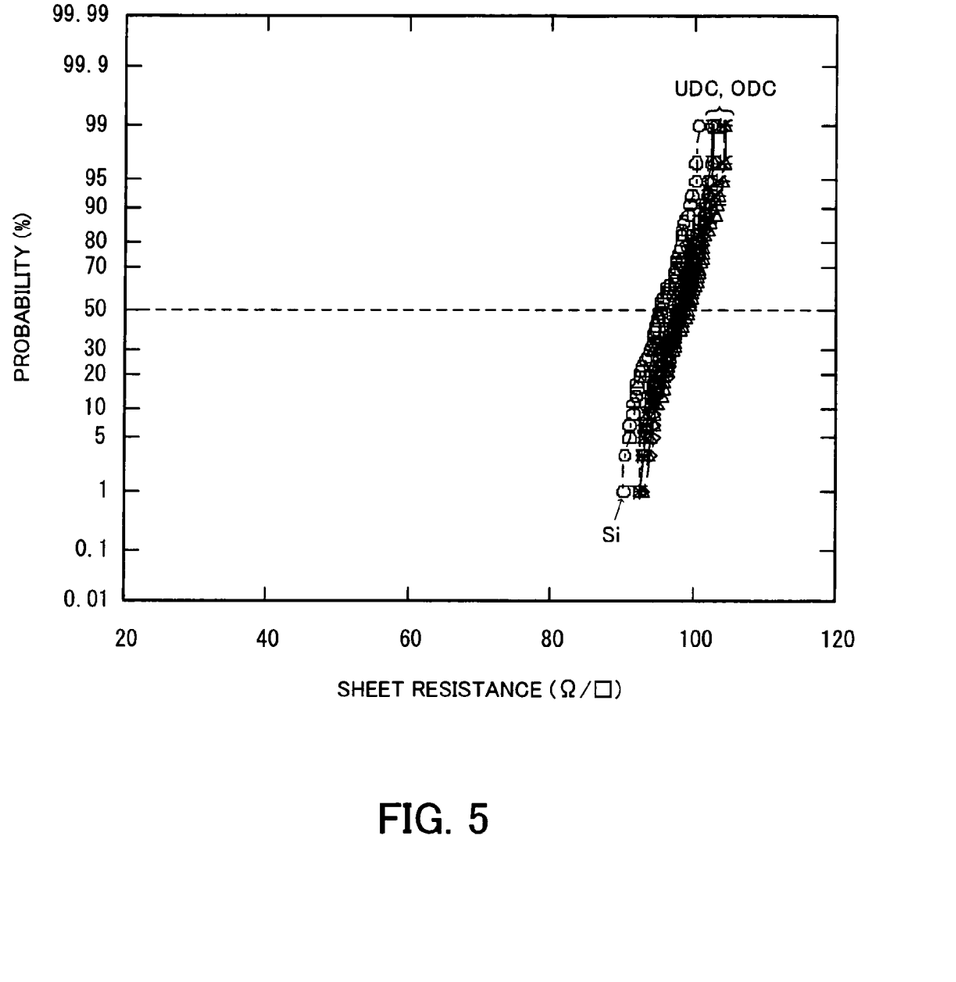
FIG. 5 shows results obtained by measuring the sheet resistance of Ta films formed on SiC films on which hydrogen plasma treatment is performed.

FIG. 5 shows results obtained by measuring the sheet resistance of Ta films formed on SiC films on which hydrogen plasma treatment is performed. In FIG. 5, a horizontal axis indicates the sheet resistance (Ω/□) of the Ta films and a vertical axis indicates a probability (%).

Samples obtained by irradiating UDC films or ODC films each having a predetermined dielectric constant with hydrogen plasma in a vacuum CVD chamber and forming Ta films with a thickness of 18 nm in the CVD chamber are used. In this case, the hydrogen plasma treatment is performed at a hydrogen gas flow rate of about 4,000 sccm (1 sccm=1 mL/min (at 0° C. and 101.3 kPa)), a pressure of about 4.0 Torr (1 Torr=133.32 Pa), and an RF power of about 200 W for about 60 seconds.

Three samples (indicated by the letters "UDC" in FIG. 5) obtained by performing the hydrogen plasma treatment on UDC films with different dielectric constants and forming Ta films with the predetermined thickness and three samples (indicated by the letters "ODC" in FIG. 5) obtained by performing the hydrogen plasma treatment on ODC films with different dielectric constants and forming Ta films with the predetermined thickness are used. In FIG. 5, the relationship between the sheet resistance of each Ta film and the probability of existence is shown. In addition, a sample (indicated by the letters "Si" in FIG. 5) obtained by forming a Ta film with a thickness of 18 nm on an Si film is used and the relationship between the sheet resistance of the Ta film and the probability of existence is shown in FIG. 5.

As can be seen from FIG. 5, in the three samples (UDC) obtained by forming the Ta films on the UDC films on which the hydrogen plasma treatment is performed, the sheet resistance values of the Ta films at a probability level of 50 percent are about 95Ω/□. As shown in FIG. 2, in the three samples obtained by forming the Ta films on the UDC films on which the hydrogen plasma treatment is not performed, the sheet resistance values of the Ta films at a probability level of 50 percent are about 30Ω/□. By performing the hydrogen plasma treatment on the UDC films, however, the sheet resistance values of the Ta films formed thereon become approximately equal to the sheet resistance value of the Ta film formed on the Si film in the sample (Si).

The same applies to the three samples (ODC) obtained by forming the Ta films on the ODC films on which the hydrogen plasma treatment is performed. As shown in FIG. 2, in the three samples obtained by forming the Ta films on the ODC films on which the hydrogen plasma treatment is not performed, the sheet resistance values of the Ta films at a probability level of 50 percent are about 80 to 85Ω/□. By performing the hydrogen plasma treatment on the ODC films, however, the sheet resistance values of the Ta films formed thereon become approximately equal to the sheet resistance value of the Ta film formed on the Si film in the sample (Si).

Figure 6:
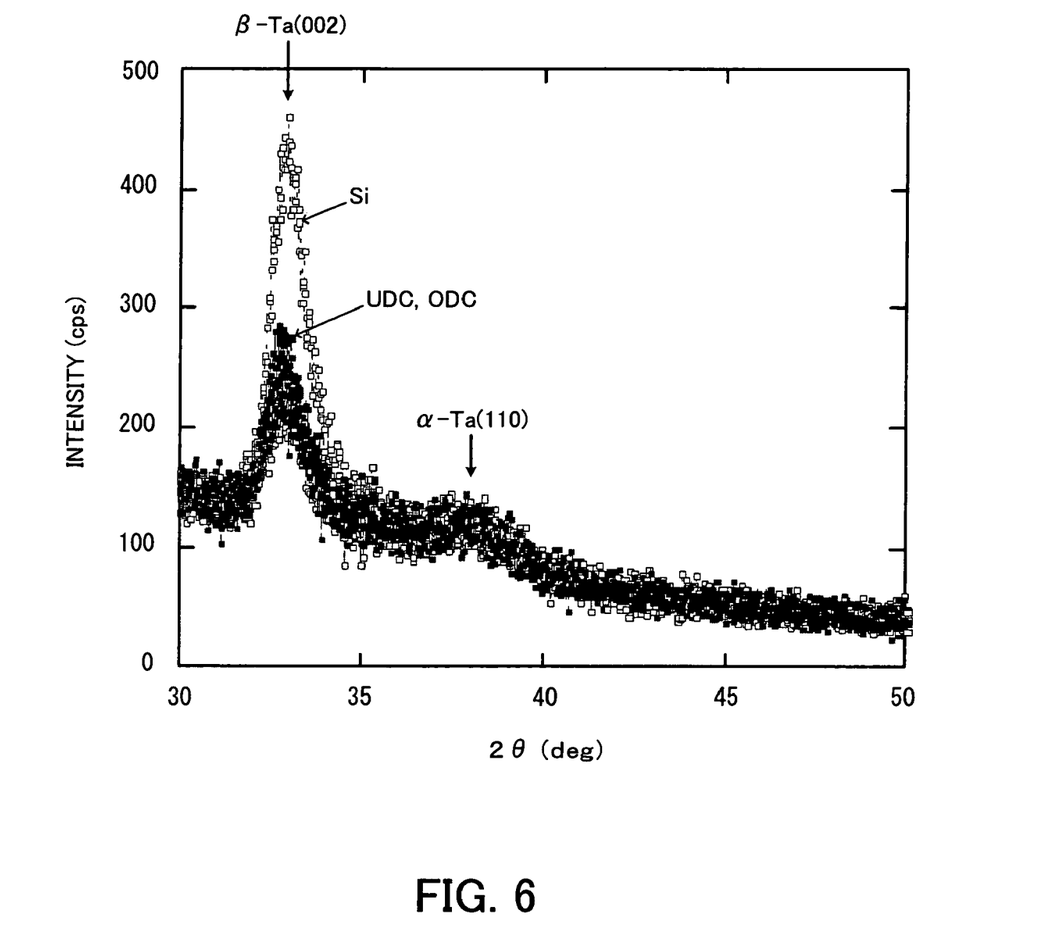
FIG. 6 shows results obtained by analyzing the crystal structure of Ta films formed on SiC films on which hydrogen plasma treatment is performed.

FIG. 6 shows results obtained by analyzing the crystal structure of Ta films formed on SiC films on which hydrogen plasma treatment is performed. An XRD system is used for analyzing the crystal structure of the Ta films. In FIG. 6, a horizontal axis indicates a diffraction angle 2θ (deg) and a vertical axis indicates the intensity (cps) of diffracted X rays. In FIG. 6, results obtained by analyzing the crystal structure of the Ta film formed on the Si film are also shown.

As can be seen from FIG. 6, the crystal structure of Ta films in samples (indicated by the letters "UDC" in FIG. 6) formed on UDC films on which hydrogen plasma treatment is performed is approximately equal to that of Ta films in samples (indicated by the letters "ODC" in FIG. 6) formed on ODC films on which hydrogen plasma treatment is performed. In addition, the crystal structure of the Ta films in these samples is approximately equal to that of the Ta film in the sample (indicated by the letters "Si" in FIG. 6) formed on the Si film.

With the samples (UDC) obtained by forming the Ta films on the UDC films on which hydrogen plasma treatment is performed, the peaks corresponding to β-Ta (002) remain and the peaks corresponding to α-Ta (110) have practically disappeared when compared to the results shown in FIG. 3. This means that the crystal structure of the Ta films in the samples (UDC) is close to that of the Ta film in the sample (Si) formed on the Si film.

The same applies to the samples (ODC) obtained by forming the Ta films on the ODC films on which hydrogen plasma treatment is performed. By performing hydrogen plasma treatment on the ODC films, the peaks corresponding to α-Ta (110) have practically disappeared. This means that the crystal structure of the Ta films in the samples (ODC) is close to that of the Ta film in the sample (Si) formed on the Si film.

As stated above, by forming the Ta films on the UDC films on which hydrogen plasma treatment has been performed, the formation of α-Ta crystals can be suppressed. As stated before, the likely reason for this is that methyl radicals are dissociated from the surfaces of the UDC films by the hydrogen plasma treatment and that the state of the surfaces of the UDC films becomes equal to that of the surface of the Si film. In other words, the likely reason for this is that the surfaces of the UDC films become more silicon-rich by the hydrogen plasma treatment.

Furthermore, by forming the Ta films on the ODC films on which hydrogen plasma treatment has been performed, the formation of α-Ta crystals can be suppressed. This is the same with the UDC films. Attention should also be riveted on this point. By performing hydrogen plasma treatment on the ODC films in this way, the state of the surfaces of the ODC films can be made equal to that of the surface of the Si film. In other words, the surfaces of the ODC films can be made more silicon-rich.

In the above examples, the cases where before forming the Ta films on the UDC or ODC films, hydrogen plasma treatment is performed on these SiC films are described. Ammonia plasma treatment or nitrogen plasma treatment may be performed in place of such hydrogen plasma treatment. By doing so, methyl radicals are dissociated from the surfaces of these SiC films, the surfaces of the SiC films are made more silicon-rich, and the formation of α-Ta crystals is suppressed. The above hydrogen plasma treatment, ammonia plasma treatment, and nitrogen plasma treatment include treatment by the use of plasma which contains hydrogen, ammonia, and nitrogen respectively.

By irradiating an SiC film with ultraviolet rays with a wavelength of about 100 to 400 nm, methyl radicals are dissociated from the surface of the SiC film, the surface of the SiC film is made more silicon-rich, and the formation of α-Ta crystals is suppressed.

To make the surface of an SiC film more silicon-rich, a very thin Si film (with thickness corresponding to about one to several atoms, for example) may be formed on the SiC film. By doing so, only the surface of the SiC film can be made more silicon-rich. Therefore, even if a Ta film is formed on the SiC film, the formation of α-Ta crystals is suppressed.

By controlling source gas concentration, an SiC film in which a composition gradient exists may be formed so that carbon content and silicon content will reduce and increase, respectively, with a decrease in the distance from the surface of the SiC film. By doing so, the surface of the SiC film can be made more silicon-rich. Therefore, even if a Ta film is formed on the SiC film, the formation of α-Ta crystals is suppressed.

The case where the above technique is applied to the formation of a multilayer wiring structure will now be described by giving concrete examples.

A first example of the present invention will be described first.

Figure 7:
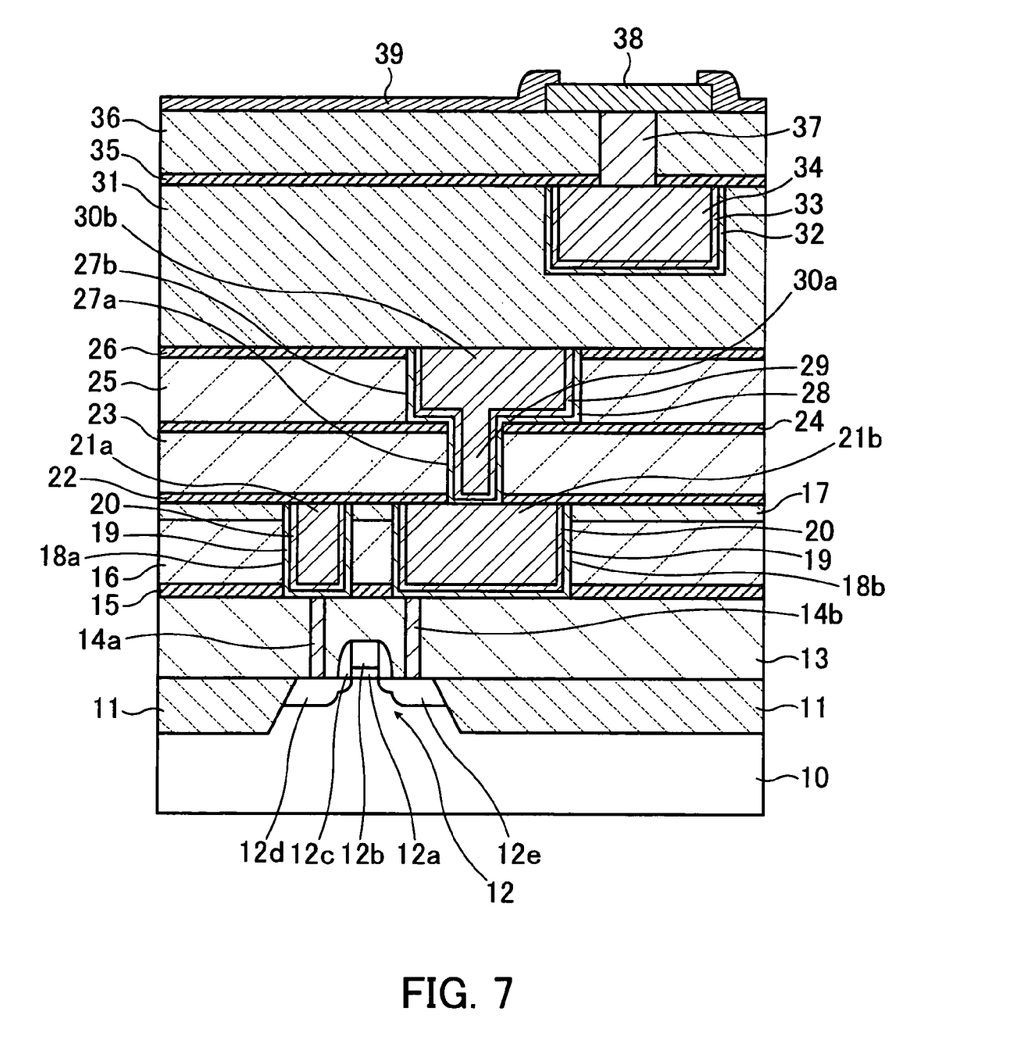
FIG. 7 is a schematic sectional view showing an important part of a multilayer wiring structure.

FIG. 7 is a schematic sectional view showing an important part of a multilayer wiring structure.

In an element region in a silicon substrate 10 defined by isolation regions 11, an insulated gate transistor 12 having a gate insulating film 12a, a gate electrode 12b, a sidewall 12c, and impurity diffusion regions 12d and 12e is formed according to an ordinary method.

After the insulated gate transistor 12 is formed, a phospho-Silicate glass (PSG) film 13 with a thickness of about 1.5 μm is formed (at a substrate temperature of about 600° C.) by the CVD method and is planarized by chemical mechanical polishing (CMP). Via grooves are then formed with a contact hole resist pattern as a mask according to an ordinary method. Tungsten (W) is embedded in the via grooves, unnecessary tungsten is removed by the CMP, and tungsten plugs 14a and 14b which connect with the impurity diffusion regions 12d and 12e, respectively, of the insulated gate transistor 12 are formed.

A UDC film with a thickness of about 50 nm to be used as a UDC etching stopper film 15 is then formed by the CVD method in which tetramethylsilane is used as source gas. In this case, the UDC etching stopper film 15 is formed at a tetramethylsilane gas flow rate of about 650 sccm, a pressure in a chamber of about 4.5 Torr, an HFRF power of about 500 W, and an LFRF power of about 150 W.

A low-k material (NCS (trade name) manufactured by Catalysts&Chemicals Ind. Co., Ltd.), being a mixture of MSQ and HSQ, is then used for forming a porous hybrid silica film 16 with a thickness of about 250 nm as a low-k insulating film by a spin-on process. In this case, NCS is cured at a temperature of about 400° C. for about 60 minutes. An SiO film with a thickness of about 100 nm to be used as an SiO cap film 17 is formed on the porous silica film 16 by the CVD method.

After a first layer wire resist pattern is formed on the SiO cap film 17, part of the SiO cap film 17, part of the porous silica film 16, and part of the UDC etching stopper film 15 are removed with the first layer wire resist pattern as a mask according to an ordinary method to form two wire grooves 18a and 18b which connect with the tungsten plugs 14a and 14b respectively.

Hydrogen plasma treatment is performed on the two wire grooves 18a and 18b formed by using a CVD system having a hydrogen plasma irradiation head. In this case, hydrogen plasma irradiation is performed at a hydrogen gas flow rate of about 4,000 sccm, a pressure in the chamber of about 4.0 Torr, and an RF power of about 200 W for about 60 seconds. By performing this hydrogen plasma treatment, methyl radicals are removed from the surface of the UDC etching stopper film 15 which gets exposed at the time of the wire grooves 18a and 18b being formed, and the surface of the UDC etching stopper film 15 becomes silicon-rich.

After the hydrogen plasma treatment is performed, a Ta film 19 with a thickness of about 30 nm is formed in the wire grooves 18a and 18b as a barrier metal film by a sputtering method. At this time, the surface of the UDC etching stopper film 15 touches the Ta film 19. However, the hydrogen plasma treatment is performed in advance on the surface of the UDC etching stopper film 15 which gets exposed at the time of the wire grooves 18a and 18b being formed, and the surface of the UDC etching stopper film 15 has become silicon-rich. Therefore, even when the surface of the UDC etching stopper film 15 touches the Ta film 19, the formation of α-Ta crystals is suppressed on the basis of the above knowledge.

After the Ta film 19 is formed in the wire grooves 18a and 18b, a Cu film 20 with a thickness of about 30 nm is formed on the Ta film 19 by the sputtering method and copper is embedded in the wire grooves 18a and 18b by a plating method. Unnecessary copper is removed by the CMP to form Cu wires 21a and 21b in a first layer. A UDC film with a thickness of about 50 nm is then formed as a copper diffusion barrier film by the CVD method. This UDC film is used as a UDC diffusion barrier film 22 and is formed at a tetramethylsilane gas flow rate of about 650 sccm, a pressure in the chamber of about 4.5 Torr, an HFRF power of about 500 W, and an LFRF power of about 150 W.

By performing the above process, a first wiring layer is formed in the multilayer wiring structure.

A hybrid porous silica film 23 with a thickness of about 200 nm is then formed of NCS on the UDC diffusion barrier film 22 by the spin-on process. After that, a middle UDC stopper film 24 is formed by the CVD method and a hybrid porous silica film 25 with a thickness of about 170 nm is formed of NCS on the middle UDC stopper film 24 by the spin-on process. A UDC diffusion barrier film 26 with a thickness of about 50 nm is formed on the porous silica film 25 by the CVD method. Conditions under which the UDC diffusion barrier film 26 is formed are the same as those under which the UDC diffusion barrier film 22 is formed.

An anti-reflection coating and the like (not shown) are formed. After that, a via groove 27a which connects with the Cu wire 21b is formed first with a via resist pattern as a mask according to an ordinary method. When the via groove 27a is formed, the UDC diffusion barrier film 22 also functions as an etching stopper film. After the via groove 27a is formed, a wire groove 27b is formed by forming an opening with a wire resist pattern as a mask according to the same ordinary method so as to expose the middle UDC stopper film 24.

The predetermined CVD system is used for performing hydrogen plasma treatment is performed on the via groove 27a and the wire groove 27b formed at a hydrogen gas flow rate of about 4,000 sccm, a pressure in the chamber of about 4.0 Torr, and an RF power of about 200 W for about 60 seconds. This is the same with the wire grooves 18a and 18b in the first layer. By performing this hydrogen plasma treatment, methyl radicals are removed from the surfaces of the UDC diffusion barrier films 22 and 26 and the middle UDC stopper film 24 which get exposed at the time of the via groove 27a and the wire groove 27b being formed, and the surfaces of the UDC diffusion barrier films 22 and 26 and the middle UDC stopper film 24 become silicon-rich.

After the hydrogen plasma treatment is performed, a Ta film 28 with a thickness of about 30 nm is formed in the via groove 27a and the wire groove 27b as a barrier metal film by the sputtering method. At this time, the surfaces of the UDC diffusion barrier films 22 and 26 touch the Ta film 28 and the surface of the middle UDC stopper film 24 touches the Ta film 28. As stated above, however, the hydrogen plasma treatment is performed in advance on the surfaces of the UDC diffusion barrier films 22 and 26 and the middle UDC stopper film 24 which get exposed at the time of the via groove 27a and the wire groove 27b being formed, and the surfaces of the UDC diffusion barrier films 22 and 26 and the middle UDC stopper film 24 have become silicon-rich. Therefore, even when the surfaces of the UDC diffusion barrier films 22 and 26 and the middle UDC stopper film 24 touch the Ta film 28, the formation of $\alpha$-Ta crystals is suppressed on the basis of the above knowledge.

After the Ta film 28 is formed in the via groove 27a and the wire groove 27b, a Cu film 29 with a thickness of about 30 nm is formed on the Ta film 28 by the sputtering method and copper, being a conductive material, is embedded in the via groove 27a and the wire groove 27b by the plating method. Unnecessary copper is removed by the CMP to form a Cu via 30a and a Cu wire 30b in a second layer.

By performing the above process, a second wiring layer is formed in the multilayer wiring structure.

An $SiO_2$ interlayer dielectric film 31 is formed first on the second wiring layer. A wire groove is formed in the interlayer dielectric film 31. A Ta film 32 and a Cu film 33 are then formed in the wire groove. Copper is embedded in the wire groove. The CMP is performed to form a Cu wire 34. A UDC diffusion barrier film 35 and an $SiO_2$ interlayer dielectric film 36 are formed on an entire surface. A via groove which finally connects with the Cu wire 34 is formed with the UDC diffusion barrier film 35 as an etching stopper. A W plug 37 is formed in the via groove and an aluminum (Al) pad 38 is formed thereon. Finally, a protection film 39 is formed on an entire surface except on part of the Al pad 38.

The multilayer wiring structure in the first example of the present invention is completed in this way.

In addition to the multilayer wiring structure in the first example of the present invention, a multilayer wiring structure having the same constitution was formed for comparison by performing the above processes except the hydrogen plasma treatment performed after the formation of the wire grooves 18a and 18b in the first layer and the hydrogen plasma treatment performed after the formation of the via groove 27a and the wire groove 27b in the second layer.

Heat treatment was performed ten times on the two multilayer wiring structures formed in this way at a temperature of about 400° C. for about 30 minutes and circuit evaluations were performed. As a result, with the multilayer wiring structure for which hydrogen plasma treatment was not performed, an increase in leakage current, an increase in wire resistance, or the like took place after the heat treatment. With the multilayer wiring structure in the first example of the present invention for which the hydrogen plasma treatment was performed, on the other hand, an increase in leakage current, an increase in wire resistance, or the like did not take place after the heat treatment. Furthermore, as a result of observing its section by using an electron microscope, copper diffusion did not take place near the region where the UDC etching stopper film 15 is touching the Ta film 19, the region where the UDC diffusion barrier film 22 is touching the Ta film 28, the region where the middle UDC stopper film 24 is touching the Ta film 28, or the region where the UDC diffusion barrier film 26 is touching the Ta film 28.

Performing the hydrogen plasma treatment on the UDC films makes it possible to effectively suppress copper diffusion while securing a low dielectric constant. Therefore, a semiconductor device having a high-performance multilayer wiring structure with high reliability can be fabricated.

A second example of the present invention will now be described. Components in a multilayer wiring structure in the second example of the present invention that are the same as those in the multilayer wiring structure in the first example of the present invention are marked with the same symbols.

A method for forming the multilayer wiring structure in the second example of the present invention differs from the method for forming the multilayer wiring structure in the first example of the present invention only in that ammonia plasma treatment is performed in place of the hydrogen plasma treatment. The constitution of the multilayer wiring structure in the second example of the present invention is the same as that of the multilayer wiring structure in the first example of the present invention.

That is to say, after the wire grooves 18a and 18b in the first layer shown in FIG. 7 are formed, ammonia plasma treatment is performed on the wire grooves 18a and 18b by using a CVD system having an ammonia plasma irradiation head. In addition, after the via groove 27a and the wire groove 27b in the second layer shown in FIG. 7 are formed, ammonia plasma treatment is performed by using the predetermined CVD system. In both processes, the ammonia plasma treatment is performed at an ammonia gas flow rate of about 4,000 sccm, a pressure in a chamber of about 2.3 Torr, and an RF power of about 200 W for about 60 seconds.

By performing the ammonia plasma treatment, methyl radicals are removed from the surface of the UDC etching stopper film 15 which gets exposed at the time of the wire grooves 18a and 18b being formed and from the surfaces of the UDC diffusion barrier films 22 and 26 and the middle UDC stopper film 24 which get exposed at the time of the via groove 27a and the wire groove 27b being formed, and the surfaces of the UDC etching stopper film 15, the UDC diffusion barrier films 22 and 26, and the middle UDC stopper film 24 become silicon-rich. This is the same with the first example of the present invention in which the hydrogen plasma treatment is performed. By forming the Ta film 19, being a barrier metal film, in the wire grooves 18a and 18b after the ammonia plasma treatment and forming the Ta film 28, being a barrier metal film, in the via groove 27a and the wire groove 27b after the ammonia plasma treatment, the formation of α-Ta crystals is suppressed.

Heat treatment was performed ten times on the multilayer wiring structure in the second example of the present invention formed in this way at a temperature of about 400° C. for about 30 minutes and circuit evaluations were performed. This is the same with the first example of the present invention. As a result, with a multilayer wiring structure formed for comparison, that is to say, a multilayer wiring structure for which ammonia plasma treatment was not performed, an increase in leakage current, an increase in wire resistance, or the like took place after the heat treatment. With the multilayer wiring structure in the second example of the present invention for which the ammonia plasma treatment was performed, on the other hand, an increase in leakage current, an increase in wire resistance, or the like did not take place after the heat treatment. Furthermore, as a result of observing its section by using an electron microscope, copper diffusion did not take place near the region where the UDC etching stopper film 15 is touching the Ta film 19, the region where the UDC diffusion barrier film 22 is touching the Ta film 28, the region where the middle UDC stopper film 24 is touching the Ta film 28, or the region where the UDC diffusion barrier film 26 is touching the Ta film 28.

Performing the ammonia plasma treatment on the UDC films makes it possible to effectively suppress copper diffusion while securing a low dielectric constant. Therefore, a semiconductor device having a high-performance multilayer wiring structure with high reliability can be fabricated.

A third example of the present invention will now be described. Components in a multilayer wiring structure in the third example of the present invention that are the same as those in the multilayer wiring structure in the first example of the present invention are marked with the same symbols.

A method for forming the multilayer wiring structure in the third example of the present invention differs from the method for forming the multilayer wiring structure in the first example of the present invention only in that nitrogen plasma treatment is performed in place of the hydrogen plasma treatment. The constitution of the multilayer wiring structure in the third example of the present invention is the same as that of the multilayer wiring structure in the first example of the present invention.

That is to say, after the wire grooves 18a and 18b in the first layer shown in FIG. 7 are formed, nitrogen plasma treatment is performed on the wire grooves 18a and 18b by using a CVD system having a nitrogen plasma irradiation head. In addition, after the via groove 27a and the wire groove 27b in the second layer shown in FIG. 7 are formed, nitrogen plasma treatment is performed by using the predetermined CVD system. In both processes, the nitrogen plasma treatment is performed at a nitrogen gas flow rate of about 4,000 sccm, a pressure in a chamber of about 2.3 Torr, and an RF power of about 100 W for about 60 seconds.

By performing the nitrogen plasma treatment, the surface of the UDC etching stopper film 15 which gets exposed at the time of the wire grooves 18a and 18b being formed and the surfaces of the UDC diffusion barrier films 22 and 26 and the middle UDC stopper film 24 which get exposed at the time of the via groove 27a and the wire groove 27b being formed become silicon-rich. As a result, even when the Ta film 19 or 28 is formed, the formation of α-Ta crystals is suppressed.

Heat treatment was performed ten times on the multilayer wiring structure in the third example of the present invention formed in this way at a temperature of about 400° C. for about 30 minutes and circuit evaluations were performed. This is the same with the first example of the present invention. As a result, with a multilayer wiring structure formed for comparison, that is to say, a multilayer wiring structure for which nitrogen plasma treatment was not performed, an increase in leakage current, an increase in wire resistance, or the like took place after the heat treatment. With the multilayer wiring structure in the third example of the present invention for which the nitrogen plasma treatment was performed, on the other hand, an increase in leakage current, an increase in wire resistance, or the like did not take place after the heat treatment. Furthermore, as a result of observing its section by using an electron microscope, copper diffusion did not take place near the region where the UDC etching stopper film 15 is touching the Ta film 19, the region where the UDC diffusion barrier film 22 is touching the Ta film 28, the region where the middle UDC stopper film 24 is touching the Ta film 28, or the region where the UDC diffusion barrier film 26 is touching the Ta film 28.

Performing the nitrogen plasma treatment on the UDC films makes it possible to effectively suppress copper diffusion while securing a low dielectric constant. Therefore, a semiconductor device having a high-performance multilayer wiring structure with high reliability can be fabricated.

A fourth example of the present invention will now be described. Components in a multilayer wiring structure in the fourth example of the present invention that are the same as those in the multilayer wiring structure in the first example of the present invention are marked with the same symbols.

A method for forming the multilayer wiring structure in the fourth example of the present invention differs from the method for forming the multilayer wiring structure in the first example of the present invention only in that ultraviolet treatment is performed in place of the hydrogen plasma treatment. The constitution of the multilayer wiring structure in the fourth example of the present invention is the same as that of the multilayer wiring structure in the first example of the present invention.

That is to say, after the wire grooves 18a and 18b in the first layer shown in FIG. 7 are formed, ultraviolet treatment is performed on the wire grooves 18a and 18b in an atmosphere of nitrogen gas or an inert gas, such as argon gas, by performing ultraviolet irradiation with an ultraviolet lamp. In addition, after the via groove 27a and the wire groove 27b in the second layer shown in FIG. 7 are formed, ultraviolet treatment is performed in the predetermined atmosphere by using the ultraviolet lamp. In both processes, the ultraviolet irradiation is performed for about 8 minutes.

By performing the ultraviolet treatment, the surface of the UDC etching stopper film 15 which gets exposed at the time of the wire grooves 18a and 18b being formed and the surfaces of the UDC diffusion barrier films 22 and 26 and the middle UDC stopper film 24 which get exposed at the time of the via groove 27a and the wire groove 27b being formed become silicon-rich. As a result, even when the Ta film 19 or 28 is formed, the formation of α-Ta crystals is suppressed.

Heat treatment was performed ten times on the multilayer wiring structure in the fourth example of the present invention formed in this way at a temperature of about 400° C. for about 30 minutes and circuit evaluations were performed. This is the same with the first example of the present invention. As a result, with a multilayer wiring structure formed for comparison, that is to say, a multilayer wiring structure for which ultraviolet treatment was not performed, an increase in leakage current, an increase in wire resistance, or the like took place after the heat treatment. With the multilayer wiring structure in the fourth example of the present invention for which the ultraviolet treatment was performed, on the other hand, an increase in leakage current, an increase in wire resistance, or the like did not take place after the heat treatment. Furthermore, as a result of observing its section by using an electron microscope, copper diffusion did not take place near the region where the UDC etching stopper film 15 is touching the Ta film 19, the region where the UDC diffusion barrier film 22 is touching the Ta film 28, the region where the middle UDC stopper film 24 is touching the Ta film 28, or the region where the UDC diffusion barrier film 26 is touching the Ta film 28.

Performing the ultraviolet treatment on the UDC films makes it possible to effectively suppress copper diffusion while securing a low dielectric constant. Therefore, a semiconductor device having a high-performance multilayer wiring structure with high reliability can be fabricated.

A fifth example of the present invention will now be described. Components in a multilayer wiring structure in the fifth example of the present invention that are the same as those in the multilayer wiring structure in the first example of the present invention are marked with the same symbols.

A method for forming the multilayer wiring structure in the fifth example of the present invention differs from the method for forming the multilayer wiring structure in the first example of the present invention only in that an Si layer formation process is performed in place of the hydrogen plasma treatment. The constitution of the multilayer wiring structure in the fifth example of the present invention differs from the constitution of the multilayer wiring structure in the first example of the present invention only in that it includes an Si layer.

That is to say, after the wire grooves 18a and 18b in the first layer shown in FIG. 7 are formed, an Si layer formation process for placing the substrate in an atmosphere of, for example, silane ($SiH_4$) gas and for forming a very thin Si layer with thickness corresponding to, for example, about one atom in the wire grooves 18a and 18b and the like by utilizing surface adsorption. In addition, after the via groove 27a and the wire groove 27b in the second layer shown in FIG. 7 are formed, the same Si layer formation process is performed.

By performing the Si layer formation processes, the surface of the UDC etching stopper film 15 which gets exposed at the time of the wire grooves 18a and 18b being formed and the surfaces of the UDC diffusion barrier films 22 and 26 and the middle UDC stopper film 24 which get exposed at the time of the via groove 27a and the wire groove 27b being formed become silicon-rich. As a result, even when the Ta film 19 or 28 is formed, the formation of α-Ta crystals is suppressed.

Therefore, a semiconductor device having a high-performance multilayer wiring structure with high reliability can be fabricated. Even if such an Si layer is formed on the Cu wire 21b, the Si layer itself is very thin and is apt to form silicide in an environment in which subsequent heat treatment is performed. Accordingly, continuity between the Cu wire 21b and the Cu via 30a is secured.

In each of the above first through fifth examples of the present invention, treatment (process) performed after the formation of the wire grooves 18a and 18b in the first layer and treatment (process) performed after the formation of the via groove 27a and the wire groove 27b in the second layer are the same. However, treatment (process) performed after the formation of the wire grooves 18a and 18b in the first layer may differ from treatment (process) performed after the formation of the via groove 27a and the wire groove 27b in the second layer. For example, it is possible to perform hydrogen plasma treatment after the formation of the wire grooves 18a and 18b in the first layer and to perform ammonia plasma treatment after the formation of the via groove 27a and the wire groove 27b in the second layer. By using such a method, the same effect that is described above can be obtained and a high-performance semiconductor device with high reliability can be fabricated. The same applies to the other combinations of treatment (process).

A sixth example of the present invention will now be described. Components in a multilayer wiring structure in the sixth example of the present invention that are the same as those in the multilayer wiring structure in the first example of the present invention are marked with the same symbols.

In the sixth example of the present invention, source gas concentration is controlled when each SiC film is formed by the CVD method. By doing so, a composition gradient is formed in each SiC film obtained. That is to say, carbon content reduces with a decrease in the distance from the surface of each SiC film. For example, when each of the UDC etching stopper film 15, the UDC diffusion barrier films 22 and 26, and the middle UDC stopper film 24 shown in FIG. 7 is formed, the flow rate of tetramethylsilane gas, being source gas, is gradually reduced from the beginning of film formation and the flow rate of oxygen gas is gradually increased. Alternatively, when each of the UDC etching stopper film 15, the UDC diffusion barrier films 22 and 26, and the middle UDC stopper film 24 shown in FIG. 7 is formed, tetramethylsilane gas is gradually switched to silane gas or the like. Using such a method makes it possible to make carbon content on the surface of each SiC film close to carbon content in an ODC or Si film.

By using the above method, silicon-rich regions are formed on the surface of the UDC etching stopper film 15 which gets exposed at the time of the wire grooves 18a and 18b being formed and the surfaces of the UDC diffusion barrier films 22 and 26 and the middle UDC stopper film 24 which get exposed at the time of the via groove 27a and the wire groove 27b being formed become silicon-rich. As a result, even when the Ta film 19 or 28 is formed, the formation of α-Ta crystals is suppressed. Therefore, a semiconductor device having a high-performance multilayer wiring structure with high reliability can be fabricated.

It is possible to form the UDC etching stopper film 15, the UDC diffusion barrier films 22 and 26, and the middle UDC stopper film 24 by the above method and to perform treatment (process) described in any of the above first through fifth examples of the present invention after the formation of the wire grooves 18a and 18b in the first layer and the formation of the via groove 27a and the wire groove 27b in the second layer.

In the above examples, Ta is used as barrier metal. However, even if tantalum nitride (TaN), titanium (Ti), titanium nitride (TiN), W, tungsten nitride (WN), zirconium (Zr), zirconium nitride (ZrN), vanadium (V), vanadium nitride (VN), titanium zirconium (TiZr), or titanium zirconium nitride (TiZrN) is used as barrier metal, treatment (process) on an SiC film or an SiC film formation method described in any of the above first through sixth examples of the present invention can be applied. Furthermore, a combination of two or more of these metals may be used as barrier metal. In this case, treatment (process) on an SiC film or an SiC film formation method described in any of the above first through sixth examples of the present invention can also be applied.

The above formation conditions are examples. These conditions can be changed properly according to the form of a multilayer wiring structure to be formed, required characteristics of a device, or the like.

In the present invention, the surface of an SiC film which touches a barrier metal film in each groove in a multilayer wiring structure is made silicon-rich. Therefore, it is possible to prevent a conductive material in each groove from piercing through a barrier metal film and diffusing, while securing a low dielectric constant. As a result, a high-performance multilayer wiring structure with high reliability can be realized and a highly reliable high-performance semiconductor device having such a multilayer wiring structure can be realized.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A method for fabricating a semiconductor device having multilayer wiring, the method comprising the steps of:
    forming a multilayer structure including insulating films and SiC films, wherein a composition gradient is formed in each of the SiC films so that an upper portion of each SiC film becomes silicon-rich;
    forming a groove in which an SiC film is exposed in the multilayer structure;
    forming a barrier metal film in the groove; and
    embedding a conductive material in the groove in which the barrier metal film is formed,
    wherein the step of forming the multilayer structure includes:
        controlling the source gas concentration during a formation of the SiC films so that each of the SiC films includes the composition gradient formed therein, with carbon content varying gradually in each of the SiC films to form the silicon-rich upper portion therein.

2. The method according to claim 1, wherein the SiC films are formed by performing chemical vapor deposition with organosilane as the source gas.

3. The method according to claim 1, further comprising, after the step of forming the groove in which the SiC film is exposed in the multilayer structure, the step of making a surface of the SiC film which gets exposed in the groove at the time of the groove being formed silicon-rich.

4. The method according to claim 1, wherein the barrier metal film contains at least one of Ta, TaN, Ti, TiN, W, WN, Zr, ZrN, V, VN, TiZr, and TiZrN.

5. The method according to claim 1, wherein the SiC films are formed by performing chemical vapor deposition with tetramethylsilane as the source gas.

6. The method according to claim 5, wherein tetramethylsilane gas is gradually switched to the silane gas.

7. A semiconductor device having multilayer wiring, the device comprising:
    a multilayer structure including SiC films and insulating films;
    a groove which is formed in the multilayer structure and in which one of the SiC films is exposed;
    a barrier metal film formed in the groove; and
    a conductive material embedded in the groove in which the barrier metal film is formed,
    wherein a surface of the one SiC film which is touching the barrier metal film is silicon-rich, and a composition gradient is formed in each of the SiC films so that carbon content varies gradually in each SiC film to form an upper portion thereof that is silicon-rich.

8. The semiconductor device according to claim 7, wherein the barrier metal film contains at least one of Ta, TaN, Ti, TiN, W, WN, Zr, ZrN, V, VN, TiZr, and TiZrN.

9. The semiconductor device according to claim 7, wherein dielectric constants of the SiC films are about 2.5 to about 4.5.

10. The method according to claim 5, wherein a flow rate of tetramethylsilane gas is gradually reduced from the beginning of film formation and a flow rate of oxygen gas is gradually increased.

* * * * *